United States Patent [19]

Ellis

[11] Patent Number: 4,927,477

[45] Date of Patent: May 22, 1990

[54] METHOD FOR MAKING A FLUSH SURFACE LAMINATE FOR A MULTILAYER CIRCUIT BOARD

[75] Inventor: Theron L. Ellis, Vestal, N.Y.

[73] Assignee: International Business Machines Corporation, Armonk, N.Y.

[21] Appl. No.: 183,462

[22] Filed: Apr. 15, 1988

Related U.S. Application Data

[63] Continuation of Ser. No. 769,524, Aug. 26, 1985, abandoned.

[51] Int. Cl.$^5$ .................... B32B 31/26; B32B 31/00; C09J 5/10
[52] U.S. Cl. .................... 156/182; 156/228; 156/289; 156/306.9; 156/307.7; 156/330
[58] Field of Search ............. 156/182, 228, 257, 261, 156/288, 323, 309.6, 306.9, 307.7, 330, 289, 256; 29/830, 848, 849

[56] References Cited

U.S. PATENT DOCUMENTS

| | | | |
|---|---|---|---|
| 3,161,945 | 12/1965 | Anderson | 29/155.5 |
| 3,791,858 | 2/1974 | McPherson | 117/201 |
| 4,030,190 | 6/1977 | Varker | 29/625 |
| 4,030,190 | 6/1977 | Varker | 29/625 |
| 4,180,608 | 12/1979 | Del | 428/196 |
| 4,354,895 | 10/1982 | Ellis | 156/631 |
| 4,496,793 | 1/1985 | Hanson | 29/830 |
| 4,606,787 | 8/1986 | Pelligrino | 156/632 |

FOREIGN PATENT DOCUMENTS

| | | |
|---|---|---|
| 2444698 | 4/1976 | Fed. Rep. of Germany . |
| 0106234 | 8/1980 | Japan . |
| 83/03065 | 9/1983 | PCT Int'l Appl. ............ 29/848 |

OTHER PUBLICATIONS

"High Conductivity Ground Planes for Epoxy Boards"; IBM Bulletin; Johnson; Jul. 1978; pp. 558–559.
IBM Technical Disclosure Bulletin, vol. 10, No. 4, pp. 359–360, Sep. 1967, Peter et al, "Multilayer Circuit Fabrication".
IBM Technical Disclosure Bulletin, vol. 7, No. 2, pp. 154–155, Jul. 1964, Haddad, "Multilayer Laminated Circuit Construction".
IBM Technical Disclosure Bulletin, vol. 9, No. 3, pp. 236–237, Aug. 1966, Pittnood et al., "Producing Printed Circuits".
IBM Technical Disclosure Bulletin, vol. 10, No. 1, p. 12, Jul. 1967, Ellis, "Lamination Process".
IBM Technical Disclosure Bulletin, vol. 10, No. 1, p. 12, Jun. 1967, T. L. Ellis, "Lamination Process".
IBM Technical Disclosure Bulletin, vol. 10, No. 4, pp. 359–360, Sep. 1967, A. E. Peter, et al, "Multilayer Circuit Fabrication".
IBM Technical Disclosure Bulletin, vol. 7, No. 2, pp.1 54–155, Jul. 1964, M. M. Haddad, "Multilayer Laminated Circuit Construction".
IBM Technical Disclosure Bulletin, vol. 9, No. 3, pp. 236–237, Aug. 1966, D. G. Pittwood et al, "Producing Printed Circuits".
Johnson, High Conductivity Ground Planes for Epoxy Board, Jul. 1978, pp. 558–559.

Primary Examiner—George F. Lesmes
Assistant Examiner—J. Davis
Attorney, Agent, or Firm—David L. Adour; Shelley M. Beckstrand; Maurice H. Klitzman

[57] ABSTRACT

A method for making flush circuit laminates for use in constructing a multilayer circuit board is disclosed. The method comprises laminating together a dielectric sheet(s) of material, such as glass cloth impregnated with epoxy resin, placed between predrilled or prepunched sheets of a conductive material, such as copper, to form the desired flush circuit laminate, such as a flush surface power core, which, in turn, may be used with other laminates to construct the desired multilayer circuit board. This method allows thinner laminates to be made with acceptable dimensional tolerances which provides improved impedance characteristics compared to laminates made using conventional processes. Thus, the method provide a method of making a more compact, higher speed multilayer circuit board without sacrificing circuit density on the circuit board. If desired, the method may be carried out using all dry processes.

5 Claims, 2 Drawing Sheets

METHOD FOR MAKING A FLUSH SURFACE LAMINATE FOR A MULTILAYER CIRCUIT BOARD

This application is a continuation of application Ser. No. 769,524 filed on Aug. 26, 1985, now abandoned.

BACKGROUND OF THE INVENTION

The present invention relates to methods for making multilayer circuit boards, and more particularly relates to methods for making flush surface laminates for constructing multilayer circuit boards, such as printed circuit boards used in computers and other such equipment.

In the manufacture of multilayer printed circuit boards for certain applications there is a need to make a more compact, higher speed board without sacrificing circuit density on the board. This can be accomplished using power core and/or signal core laminates to make a multilayer circuit board having an electrical resistance between layers of approximately 50 ohms rather than 80 ohms as provided with conventional circuit boards. However, using conventional printed circuit board manufacturing techniques, it is difficult, if not impossible to achieve this relatively low resistance circuit board structure within desired tolerances.

Also, conventional printed circuit board manufacturing techniques normally require chemical processing steps, such as applying photoresist, additively plating circuit lines or the like, and flash etching, which result in a "wet" process. However, for environmental and safety reasons, it is preferable to make circuit boards using "dry" processes, that is processes, such as plasma gas treatment and mechanical drilling, which do not involve chemical processing steps of the type associated with wet processes.

Thus, it is highly desirable to manufacture a multilayer circuit board, for use in a computer or other such equipment, having a relatively low resistance between layers of the circuit board. Also, it is even more desirable to manufacture such a multilayer circuit board using dry processes.

SUMMARY OF THE INVENTION

Therefore, an object of the present invention is to provide a relatively simple and reliable method for manufacturing a multilayer circuit board having a desired relatively low electrical resistance between layers of the circuit board.

Another object of the present invention is to provide a method for manufacturing power core laminates for use in making a laminated multilayer circuit board having a desired relatively low electrical resistance between layers of the circuit board.

Still another object of the present invention is to provide a method, using dry processes, for manufacturing a multilayer circuit board having a desired relatively low electrical resistance between layers of the circuit board.

These and other objects of the present invention are attained by constructing a multilayer circuit board using flush surface laminates which may be made using dry processes. The flush surface laminates are made by sandwiching a sheet of dielectric material between two sheets of conductive material with at least one sheet of the conductive material having at least one opening extending therethrough between a first surface of the conductive sheet in contact with the dielectric material and a second surface of the conductive sheet forming an outside surface of the sandwich. Then, the sandwich of dielectric and conductive materials is positioned between a top plate and a bottom plate which are used to press the sandwich together while maintaining the sheets of dielectric and conductive material in registration with each other. The sandwich is pressed together between the top and the bottom plates at a temperature and pressure sufficient for the dielectric material to flow into the opening in the sheet of conductive material and form a flush surface laminate with the sheets of conductive material. Several such flush surface laminates may be made according to the foregoing method, in the form of power cores and the like, which then may be laminated together with flush surface signal cores and the like, to form the desired multilayer circuit board.

Flush surface laminates according to the present invention may be made thinner than conventional laminates used to construct multilayer circuit boards, while maintaining necessary dimensional tolerances. Thus, use of the flush surface laminates according to the present invention allows construction of a multilayer circuit board with a relatively low electrical resistance between layers of the circuit board thereby providing a relatively compact, high speed, multilayer circuit board without sacrificing circuit density on the board.

BRIEF DESCRIPTION OF THE DRAWING

Other objects and advantages of the present invention will be apparent from the following description in conjunction with the accompanying drawing, wherein like reference numerals identify like elements, and in which.

DESCRIPTION OF THE PREFERRED EMBODIMENT

Figure 1:
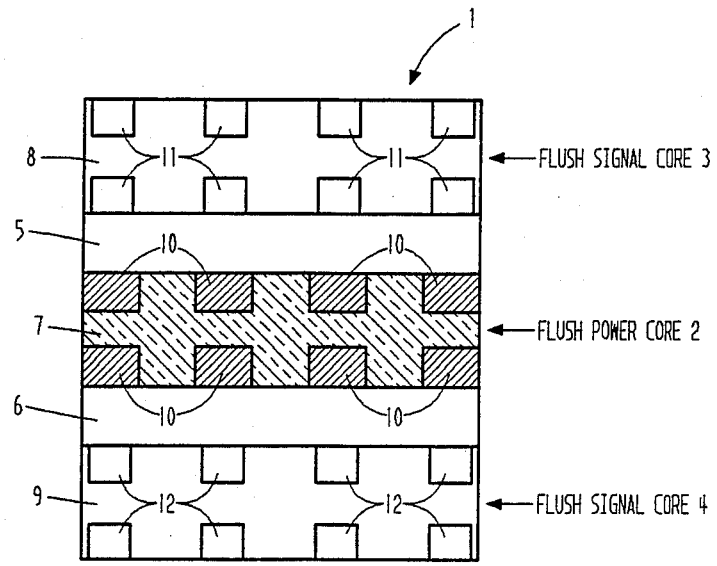
FIG. 1 is a cross-sectional view of part of a multilayer circuit board constructed according to the principles of the present invention by laminating together a flush surface power core between two flush surface signal cores.

Referring to FIG. 1, a cross-sectional view is shown of part of a multilayer circuit board 1 constructed by laminating together a flush surface power core 2 between a first (top) flush surface signal core 3 and a second (bottom) flush surface signal core 4 according to the principles of the present invention. As shown in FIG. 1, there is a first (top) dielectric layer 5 separating the top flush surface signal core 3 from the power core 2 and a second (bottom) dielectric layer 6 separating the bottom flush surface signal core 4 from the power core 2. The dielectric layers 5 and 6 may comprise glass cloth impregnated with epoxy resin, or other such suitable material, which is cured during lamination with the signal cores 3 and 4, and the power core 2, to form the composite multilayer circuit board structure 1.

Also, as shown in FIG. 1, the flush surface power core 2 comprises a dielectric material 7 having conductive material 10 embedded therein to form a power plane(s), or other such structures, for providing electrical power from a power supply (not shown) to the multilayer circuit board 1. In addition, as shown in FIG. 1, the top flush surface signal core 3 comprises a dielectric material 8 having conductors 11 embedded therein to form electrical circuitry for providing desired electrical connections, such as electrical connections between electronic devices (not shown) which may be mounted on the multilayer circuit board 1. Similarly, the bottom flush surface signal core 4 comprises a dielectric material 9 having conductors 12 embedded therein to form electrical circuitry for providing desired electrical connections. Although not shown in FIG. 1, it should be understood that, if desired, conductive vias (electrical connections) may be made between the power core 2 and the signal cores 3 and 4, or just between the signal cores 3 and 4. For example, such conductive vias may be made by drilling, or otherwise making, holes interconnecting certain of the conductors 11, and/or the conductors 12, with the conductive material 10 forming the power plane(s) of the multilayer circuit board 1, and then applying a coating of conductive material, such as copper, to the walls of the holes to provide electrical continuity between the conductors 11 and/or 12 and the conductive material 10 forming the power plane.

Figure 2:
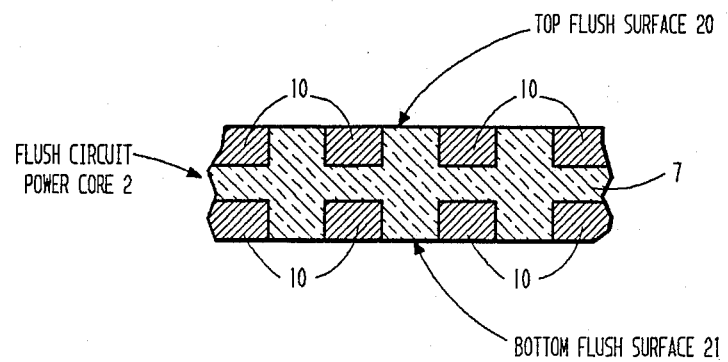
FIG. 2 is a cross-sectional view of the flush surface power core shown in FIG. 1.

Referring to FIG. 2, a cross-sectional view is shown of just the flush surface power core 2 shown in FIG. 1 which is made according to the principles of the present invention. As shown in FIG. 2, the power core 2 has a first (top) flush surface 20 and a second (bottom) flush surface 21. That is, the conductive material (power plane(s)) and the dielectric material 7 making up the power core 2 are substantially flush with each other on these outside surfaces 20 and 21 of the power core 2. The method for making this flush surface power core 2 according to the principles of the present invention is described in detail hereinafter with reference to FIGS. 3 and 4. However, it should be noted that while the following description is directed to making the power core 2, the method described is also suitable for making any other such flush surface laminate for any of a variety of purposes.

Figure 3:
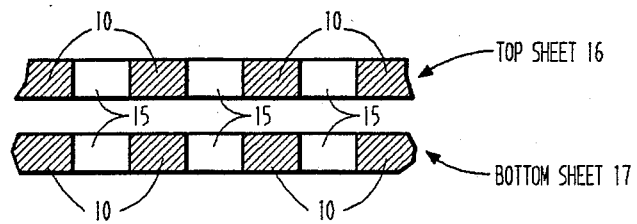
FIG. 3 is a cross-sectional view of part of two sheets of conductive material, such as copper, each having drilled or pre-punched holes for use in making the flush surface power core shown in FIG. 2 according to the principles of the present invention.

Now, referring to FIG. 3, a cross-sectional view is shown of a first (top) sheet 16, and a second (bottom) sheet 17, each made of a conductive material, such as copper, having pre-punched or drilled holes (openings) 15 extending therethrough. These sheets 16 and 17 of conductive material are suitable for making the power plane(s) 10 of the flush surface power core 2 shown in FIGS. 1 and 2 according to a dry process as described below.

Although pre-punching or drilling the holes 15 is preferred because these are dry processes, the holes 15 may be formed by any one of a variety of suitable processes including wet processes such as etching in a chemical etching bath, if desired.

As shown in FIG. 3, the holes 15 in the conductive sheets 16 and 17 are intended as clearance holes for providing drill bit clearance when drilling vias (through holes) in the multilayer circuit board 1 between, for example, the top signal core 3 and the bottom signal core 4, as mentioned previously relative to FIG. 1. Alternatively, the holes 15 may be locating holes for registration of the flush surface power core 2 with other laminates used, for example, to construct a multilayer circuit board 1 as shown in FIG. 1. In fact, as will be readily apparent to one of ordinary skill in the art to which the present invention pertains, there are a variety of reasons for providing the holes 15 in the conductive sheets 16 and 17 which eventually become the conductive plane(s) 10 of the power core 2.

Figure 4:
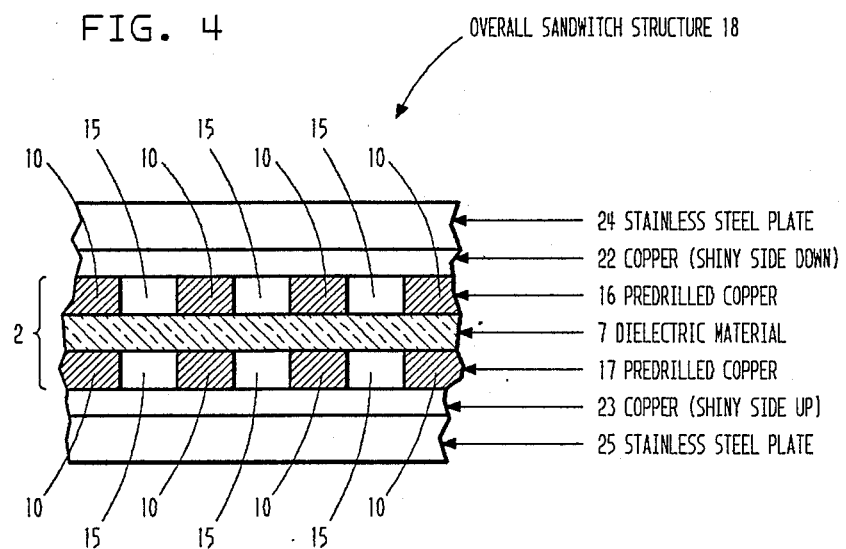
FIG. 4 is a cross-sectional view of part of a sandwich structure, including the drilled or pre-punched copper sheets shown in FIG. 3, which may be pressed together to form the flush surface power core shown in FIG. 2, according to the principles of the present invention.

FIG. 4 shows a partial cross-sectional view of an overall sandwich structure 18 which includes the drilled or pre-punched sheets 16 and 17 of conductive material shown in FIG. 3, which may be pressed together with a sheet(s) of dielectric material 7 to form the flush surface power core 2 shown in FIGS. 1 and 2. The dielectric material 7 may be an unsupported film of a dielectric material, sheets of glass cloth impregnated with epoxy resin, commonly known as sheets of prepreg, or any other such suitable dielectric material. Alternatively, if desired, the dielectric material 3 may be a combination of sheets of different dielectric materials.

Also, as shown in FIG. 4, the sandwich structure 18 comprises a first (top) sheet 22 of copper foil, and a second (bottom) sheet 23 of copper foil. The purpose of the copper foil sheets 22 and 23 is to act as release sheets so that the dielectric material 7 will not adhere to plates used in pressing the overall sandwich structure 18 together, such as plates 24, 25 shown in FIG. 4. If the drilled or pre-punched sheets 16 and 17 are copper and the dielectric material 7 is glass cloth impregnated with epoxy resin, then, preferably, the sheets 22 and 23 are each made of sheets of one ounce copper foil having a smooth (shiny) side which faces the drilled or pre-punched copper sheets 16 and 17. However, it should be noted that, if desired, the sheets 22 and 23 may be made of polyvinylfluoride or any other material suitable for use as a release sheet. Alternatively, under certain circumstances, the plates used in pressing the overall sandwich structure 18 together may be coated with a material, such as polytetrafluoroethylene, in which case use of release sheets 22, 23 is not required.

Further, as shown in FIG. 4, the overall sandwich structure 18 comprises a first, top plate 24 and a second, bottom plate 25. These plates 24 and 25 are used in pressing the sheets 7, 16 and 17 together at a temperature and pressure sufficient for the dielectric material 7 to flow into the holes 15 in the drilled or pre-punched sheets 16 and 17 of conductive material to form the desired flush surface power core 2 with power plane(s) 10 as shown in FIG. 2. The plates 24 and 25 may be made of stainless steel or other such suitable material and a conventional laminating press (not shown) may be used to press the sandwich structure 18 together. The laminating press must be capable of pressing the sandwich structure 18 together at a temperature and pressure sufficient for the dielectric material 7 to flow into the holes (openings) 15 in the predrilled or pre-punched sheets 16 and 17 of conductive material to form the flush surface power core 2. The thickness of the dielectric material 7 is selected so that as a result of curing and lamination in laminating press, a desired spacing is provided between the predrilled or pre-punched sheets 16 and 17 of conductive material thereby producing a desired impedance characteristic for the resulting flush surface power core 2.

After the pressing operation is completed, the finished flush surface power core 2 is removed from the laminating press ready for use in constructing a multilayer circuit board 1 as shown in FIG. 1. However, preferably, to enhance adhesion of the flush surface power core 2 to other laminates used in constructing the multilayer circuit board 1, the flush surfaces 20 and 21 (see FIG. 2) of the power core 2 are roughened by, for example, a plasma etching process which is a dry process. Of course, if desired, a wet roughening process may be used.

The foregoing described process for making a flush surface laminate, such as the power core 2 shown in FIG. 2, for use in constructing a circuit board, such as the multilayer circuit board 10 shown in FIG. 1, has several advantages over conventional methods of making laminates for use in constructing multilayer circuit boards. For example, a substantially thinner multilayer circuit board may be constructed using flush surface laminates according to the present invention, while still maintaining dimensional tolerances necessary to attain desired impedance characteristics for the multilayer circuit board. In part, such a relatively thin multilayer circuit board structure is possible according to the present invention because, for example, the dielectric layers 5 and 6 shown in FIG. 1, are not required to fill clearance holes, flow around signal lines, or perform other such functions, when making the multilayer circuit board 1. Thus, substantially less dielectric material may be used in the dielectric layers 5 and 6 while still maintaining dimensional tolerances necessary to attain desired electric characteristics for the resulting multilayer circuit board structure. This feature is very important since a thinner multilayer circuit board according to the present invention results in a more compact, higher speed circuit board without sacrificing performance capabilities. For example, higher speed results from electrical signals having shorter distances to travel between, for example, signal planes of the relatively thin multilayer circuit board according to the present invention.

In addition to the foregoing, there are many other advantages of flush surface laminates according to the present invention. For example, if desired, the flush surface laminates of the present invention may be made using all dry processes. As mentioned above, use of such dry processes is preferred from environmental and safety viewpoints. Also, the possibility of internal voids is reduced when making a multilayer circuit board using flush surface laminates according to the present invention since the circuit boards are thinner for the same performance capability when compared to conventional multilayer circuit boards. Further, thinner multilayer circuit boards according to the present invention are easier to drill, for example, when drilling through holes in the circuit board.

Of course, the foregoing description is directed to one particular embodiment of the present invention and various modifications and other embodiments of the present invention will be apparent to one of ordinary skill in the art to which the present invention pertains. Therefore, while the present invention has been described in conjunction with a particular embodiment it is to be understood that various modifications and other embodiments of the present invention may be made without departing from the scope of the present invention as described herein and as claimed in the appended claims.

What is claimed is:

1. A method for making a multilayer circuit board having flush surface laminates with completely flush surfaces, comprising the steps of:

sandwiching a sheet of dielectric material between two sheets of conductive material, each sheet of conductive material having at least one opening extending therethrough between a first surface of the conductive sheet in contact with the dielectric material and a second surface of the conductive sheet forming an outside surface of the sandwich; said dielectric material consisting essentially of an epoxy resin where the thickness of said dielectric material is selected such that a desired spacing is provided between the two sheets of conductive material to produce a characteristic impedance of about 50 ohms;

placing release sheets on the outside surfaces of the sandwich of dielectric and conductive materials;

positioning the sandwich of dielectric and conductive materials with the release sheets on the outside surface between a top plate and a bottom plate which may be used to press the sandwich together while maintaining the sheets of dielectric and conductive material in registration with each other by the use of said openings; and pressing the sandwich together between the top and the bottom plates at a temperature and pressure sufficient for the dielectric material to flow into the openings in the sheets of conductive material and form a first completely flush surface laminate with the sheets of conductive material;

forming a second completely flush surface laminate in the same manner as the first flush surface laminate;

placing only a layer of dielectric material between the first and the second flush surface laminates; and, pressing the first and second flush surface laminates together at a temperature and pressure sufficient to form a multilayer laminate;

said multilayer laminate having a characteristic impedance of about 50 ohms between said first and second flush surface laminates.

2. The method as recited in claim 1 further comprising the step of:

roughening the flush surfaces of the flush surface laminates.

3. The method as recited in claim 1 wherein the conductive material comprises copper.

4. The method as recited in claim 1 wherein the dielectric material comprises glass cloth impregnated with an epoxy resin.

5. The method as recited in claim 1 wherein the release sheets comprise copper.

* * * * *